United States Patent
Lucas et al.

(10) Patent No.: US 9,520,162 B2
(45) Date of Patent: Dec. 13, 2016

(54) DIMM DEVICE CONTROLLER SUPERVISOR

(71) Applicant: SanDisk Enterprise IP LLC, Milpitas, CA (US)

(72) Inventors: Gregg S. Lucas, Tucson, AZ (US); Kenneth B. Delpapa, Natick, MA (US); Robert W. Ellis, Phoenix, AZ (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 357 days.

(21) Appl. No.: 14/135,420

(22) Filed: Dec. 19, 2013

(65) Prior Publication Data

US 2015/0149700 A1    May 28, 2015

Related U.S. Application Data

(60) Provisional application No. 61/909,939, filed on Nov. 27, 2013.

(51) Int. Cl.
*G06F 3/06* (2006.01)
*G11C 5/14* (2006.01)
(Continued)

(52) U.S. Cl.
CPC .............. *G11C 5/141* (2013.01); *G11C 5/143* (2013.01); *G11C 7/20* (2013.01); *G11C 16/20* (2013.01)

(58) Field of Classification Search
CPC .................................. G11C 5/141; G11C 5/143
See application file for complete search history.

(56) References Cited

U.S. PATENT DOCUMENTS

| 4,173,737 | A | 11/1979 | Skerlos et al. |
| 4,888,750 | A | 12/1989 | Kryder et al. |

(Continued)

FOREIGN PATENT DOCUMENTS

| EP | 1 299 800 | 4/2003 |
| EP | 1465203 A1 | 10/2004 |

(Continued)

OTHER PUBLICATIONS

Office Action dated Dec. 8, 2014, received in Chinese Patent Application No. 201180021660.2, which corresponds to U.S. Appl. No. 12/726,200, 7 pages. (Olbrich).

(Continued)

*Primary Examiner* — David X Yi
*Assistant Examiner* — Zubair Ahmed
(74) *Attorney, Agent, or Firm* — Morgan, Lewis & Bockius LLP

(57) ABSTRACT

The various implementations described herein include systems, methods and/or devices used to enable performing supervisory functions for a dual in-line memory module (DIMM), at a controller in the DIMM. The method includes upon power-up, determining a power supply voltage provided to the DIMM. In accordance with a determination that power supply criteria are satisfied, the method includes: (1) performing one or more power-up operations, including initiating a usage counter, (2) monitoring a temperature of the DIMM, (3) monitoring the DIMM for occurrence of one or more of a set of predetermined trigger events, and (4) in response to detecting one of the set of predetermined trigger events, logging information corresponding to the detected predetermined event.

18 Claims, 5 Drawing Sheets

(51) Int. Cl.
*G11C 7/20* (2006.01)
*G11C 16/20* (2006.01)

(56) References Cited

U.S. PATENT DOCUMENTS

| | | |
|---|---|---|
| 4,916,652 A | 4/1990 | Schwarz et al. |
| 5,129,089 A | 7/1992 | Nielsen |
| 5,270,979 A | 12/1993 | Harari et al. |
| 5,329,491 A | 7/1994 | Brown et al. |
| 5,381,528 A | 1/1995 | Brunelle |
| 5,404,485 A | 4/1995 | Ban |
| 5,488,702 A | 1/1996 | Byers et al. |
| 5,519,847 A | 5/1996 | Fandrich et al. |
| 5,530,705 A | 6/1996 | Malone, Sr. |
| 5,537,555 A | 7/1996 | Landry et al. |
| 5,551,003 A | 8/1996 | Mattson et al. |
| 5,636,342 A | 6/1997 | Jeffries |
| 5,657,332 A | 8/1997 | Auclair et al. |
| 5,666,114 A | 9/1997 | Brodie et al. |
| 5,708,849 A | 1/1998 | Coke et al. |
| 5,765,185 A | 6/1998 | Lambrache et al. |
| 5,890,193 A | 3/1999 | Chevaliier |
| 5,930,188 A | 7/1999 | Roohparvar |
| 5,936,884 A | 8/1999 | Hasbun et al. |
| 5,943,692 A | 8/1999 | Marberg et al. |
| 5,946,714 A | 8/1999 | Miyauchi |
| 5,982,664 A | 11/1999 | Watanabe |
| 6,000,006 A | 12/1999 | Bruce et al. |
| 6,006,345 A | 12/1999 | Berry, Jr. |
| 6,016,560 A | 1/2000 | Wada et al. |
| 6,018,304 A | 1/2000 | Bessios |
| 6,044,472 A | 3/2000 | Crohas |
| 6,070,074 A | 5/2000 | Perahia et al. |
| 6,104,304 A | 8/2000 | Clark et al. |
| 6,119,250 A | 9/2000 | Nishimura et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,260,120 B1 | 7/2001 | Blumenau et al. |
| 6,295,592 B1 | 9/2001 | Jeddeloh |
| 6,311,263 B1 | 10/2001 | Barlow et al. |
| 6,408,394 B1 | 6/2002 | Vander Kamp et al. |
| 6,412,042 B1 | 6/2002 | Paterson et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,564,285 B1 | 5/2003 | Mills et al. |
| 6,647,387 B1 | 11/2003 | McKean et al. |
| 6,678,788 B1 | 1/2004 | O'Connell |
| 6,728,879 B1 | 4/2004 | Atkinson |
| 6,757,768 B1 | 6/2004 | Potter et al. |
| 6,775,792 B2 | 8/2004 | Ulrich et al. |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,865,650 B1 | 3/2005 | Morley et al. |
| 6,871,257 B2 | 3/2005 | Conley et al. |
| 6,895,464 B2 | 5/2005 | Chow et al. |
| 6,966,006 B2 | 11/2005 | Pacheco et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,024,514 B2 | 4/2006 | Mukaida et al. |
| 7,028,165 B2 | 4/2006 | Roth et al. |
| 7,032,123 B2 | 4/2006 | Kane et al. |
| 7,043,505 B1 | 5/2006 | Teague et al. |
| 7,076,598 B2 | 7/2006 | Wang |
| 7,100,002 B2 | 8/2006 | Shrader |
| 7,102,860 B2 | 9/2006 | Wenzel |
| 7,111,293 B1 | 9/2006 | Hersh et al. |
| 7,126,873 B2 | 10/2006 | See et al. |
| 7,133,282 B2 | 11/2006 | Sone |
| 7,155,579 B1 * | 12/2006 | Neils ............... G06F 13/1694 |
| | | 711/104 |
| 7,162,678 B2 | 1/2007 | Saliba |
| 7,173,852 B2 | 2/2007 | Gorobets et al. |
| 7,184,446 B2 | 2/2007 | Rashid et al. |
| 7,212,440 B2 | 5/2007 | Gorobets |
| 7,275,170 B2 | 9/2007 | Suzuki |
| 7,295,479 B2 | 11/2007 | Yoon et al. |
| 7,328,377 B1 | 2/2008 | Lewis et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,533,214 B2 | 5/2009 | Aasheim et al. |
| 7,546,478 B2 | 6/2009 | Kubo et al. |
| 7,566,987 B2 | 7/2009 | Black et al. |
| 7,571,277 B2 | 8/2009 | Mizushima |
| 7,574,554 B2 | 8/2009 | Tanaka et al. |
| 7,596,643 B2 | 9/2009 | Merry, Jr. et al. |
| 7,669,003 B2 | 2/2010 | Sinclair et al. |
| 7,681,106 B2 | 3/2010 | Jarrar et al. |
| 7,685,494 B1 | 3/2010 | Varnica et al. |
| 7,707,481 B2 | 4/2010 | Kirschner et al. |
| 7,761,655 B2 | 7/2010 | Mizushima et al. |
| 7,765,454 B2 | 7/2010 | Passint |
| 7,774,390 B2 | 8/2010 | Shin |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,945,825 B2 | 5/2011 | Cohen et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich et al. |
| 7,996,642 B1 | 8/2011 | Smith |
| 8,006,161 B2 | 8/2011 | Lestable et al. |
| 8,032,724 B1 | 10/2011 | Smith |
| 8,041,884 B2 | 10/2011 | Chang |
| 8,042,011 B2 | 10/2011 | Nicolaidis et al. |
| 8,069,390 B2 | 11/2011 | Lin |
| 8,190,967 B2 | 5/2012 | Hong et al. |
| 8,250,380 B2 | 8/2012 | Guyot |
| 8,254,181 B2 | 8/2012 | Hwang et al. |
| 8,259,506 B1 | 9/2012 | Sommer et al. |
| 8,261,020 B2 | 9/2012 | Krishnaprasad et al. |
| 8,312,349 B2 | 11/2012 | Reche et al. |
| 8,385,117 B2 | 2/2013 | Sakurada et al. |
| 8,412,985 B1 | 4/2013 | Bowers et al. |
| 8,429,436 B2 | 4/2013 | Fillingim et al. |
| 8,438,459 B2 | 5/2013 | Cho et al. |
| 8,453,022 B2 | 5/2013 | Katz |
| 8,510,499 B1 | 8/2013 | Banerjee |
| 8,531,888 B2 | 9/2013 | Chilappagari et al. |
| 8,554,984 B2 | 10/2013 | Yano et al. |
| 8,627,117 B2 | 1/2014 | Johnston |
| 8,634,248 B1 | 1/2014 | Sprouse et al. |
| 8,694,854 B1 | 4/2014 | Dar et al. |
| 8,724,789 B2 | 5/2014 | Altberg et al. |
| 8,832,384 B1 | 9/2014 | de la Iglesia |
| 8,885,434 B2 | 11/2014 | Kumar |
| 8,898,373 B1 | 11/2014 | Kang et al. |
| 8,909,894 B1 | 12/2014 | Singh et al. |
| 8,910,030 B2 | 12/2014 | Goel |
| 8,923,066 B1 | 12/2014 | Subramanian et al. |
| 9,043,517 B1 | 5/2015 | Sprouse et al. |
| 9,128,690 B2 | 9/2015 | Lotzenburger et al. |
| 9,329,789 B1 | 5/2016 | Chu et al. |
| 2001/0026949 A1 | 10/2001 | Ogawa et al. |
| 2001/0050824 A1 | 12/2001 | Buch |
| 2002/0024846 A1 | 2/2002 | Kawahara et al. |
| 2002/0032891 A1 | 3/2002 | Yada et al. |
| 2002/0036515 A1 | 3/2002 | Eldridge et al. |
| 2002/0083299 A1 | 6/2002 | Van Huben et al. |
| 2002/0099904 A1 | 7/2002 | Conley |
| 2002/0116651 A1 | 8/2002 | Beckert et al. |

(56) References Cited

U.S. PATENT DOCUMENTS

| | | |
|---|---|---|
| 2002/0122334 A1 | 9/2002 | Lee et al. |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |
| 2003/0043829 A1 | 3/2003 | Rashid et al. |
| 2003/0079172 A1 | 4/2003 | Yamagishi et al. |
| 2003/0088805 A1 | 5/2003 | Majni et al. |
| 2003/0093628 A1 | 5/2003 | Matter et al. |
| 2003/0163594 A1 | 8/2003 | Aasheim et al. |
| 2003/0163629 A1 | 8/2003 | Conley et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0204341 A1 | 10/2003 | Guliani et al. |
| 2003/0212719 A1 | 11/2003 | Yasuda et al. |
| 2003/0225961 A1 | 12/2003 | Chow et al. |
| 2004/0024957 A1 | 2/2004 | Lin et al. |
| 2004/0024963 A1 | 2/2004 | Talagala et al. |
| 2004/0057575 A1 | 3/2004 | Zhang et al. |
| 2004/0062157 A1 | 4/2004 | Kawabe |
| 2004/0073829 A1 | 4/2004 | Olarig |
| 2004/0085849 A1 | 5/2004 | Myoung et al. |
| 2004/0114265 A1 | 6/2004 | Talbert |
| 2004/0143710 A1 | 7/2004 | Walmsley |
| 2004/0148561 A1 | 7/2004 | Shen et al. |
| 2004/0153902 A1 | 8/2004 | Machado et al. |
| 2004/0158775 A1 | 8/2004 | Shibuya et al. |
| 2004/0167898 A1 | 8/2004 | Margolus et al. |
| 2004/0181734 A1 | 9/2004 | Saliba |
| 2004/0199714 A1 | 10/2004 | Estakhri et al. |
| 2004/0210706 A1 | 10/2004 | In et al. |
| 2004/0237018 A1 | 11/2004 | Riley |
| 2005/0060456 A1 | 3/2005 | Shrader et al. |
| 2005/0060501 A1 | 3/2005 | Shrader |
| 2005/0073884 A1 | 4/2005 | Gonzalez et al. |
| 2005/0108588 A1 | 5/2005 | Yuan |
| 2005/0114587 A1 | 5/2005 | Chou et al. |
| 2005/0138442 A1* | 6/2005 | Keller, Jr. ............ G06F 1/3203 713/300 |
| 2005/0144358 A1 | 6/2005 | Conley et al. |
| 2005/0144361 A1 | 6/2005 | Gonzalez et al. |
| 2005/0144367 A1 | 6/2005 | Sinclair |
| 2005/0144516 A1 | 6/2005 | Gonzalez et al. |
| 2005/0154825 A1 | 7/2005 | Fair |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0210348 A1 | 9/2005 | Totsuka |
| 2005/0231765 A1 | 10/2005 | So et al. |
| 2005/0249013 A1 | 11/2005 | Janzen et al. |
| 2005/0251617 A1 | 11/2005 | Sinclair et al. |
| 2005/0257120 A1 | 11/2005 | Gorobets et al. |
| 2005/0273560 A1 | 12/2005 | Hulbert et al. |
| 2005/0281088 A1 | 12/2005 | Ishidoshiro et al. |
| 2005/0289314 A1 | 12/2005 | Adusumilli et al. |
| 2006/0010174 A1 | 1/2006 | Nguyen et al. |
| 2006/0039196 A1 | 2/2006 | Gorobets et al. |
| 2006/0039227 A1 | 2/2006 | Lai et al. |
| 2006/0053246 A1 | 3/2006 | Lee |
| 2006/0062054 A1 | 3/2006 | Hamilton et al. |
| 2006/0069932 A1 | 3/2006 | Oshikawa et al. |
| 2006/0085671 A1 | 4/2006 | Majni et al. |
| 2006/0087893 A1 | 4/2006 | Nishihara et al. |
| 2006/0103480 A1* | 5/2006 | Moon ............... G11C 16/225 331/74 |
| 2006/0107181 A1 | 5/2006 | Dave et al. |
| 2006/0136570 A1 | 6/2006 | Pandya |
| 2006/0136655 A1 | 6/2006 | Gorobets et al. |
| 2006/0136681 A1 | 6/2006 | Jain et al. |
| 2006/0156177 A1 | 7/2006 | Kottapalli et al. |
| 2006/0184738 A1 | 8/2006 | Bridges et al. |
| 2006/0195650 A1 | 8/2006 | Su et al. |
| 2006/0224841 A1 | 10/2006 | Terai et al. |
| 2006/0244049 A1 | 11/2006 | Yaoi et al. |
| 2006/0259528 A1 | 11/2006 | Dussud et al. |
| 2006/0265568 A1 | 11/2006 | Burton |
| 2006/0291301 A1 | 12/2006 | Ziegelmayer |
| 2007/0011413 A1 | 1/2007 | Nonaka et al. |
| 2007/0033376 A1 | 2/2007 | Sinclair et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0088716 A1 | 4/2007 | Brumme et al. |
| 2007/0091677 A1 | 4/2007 | Lasser et al. |
| 2007/0101096 A1 | 5/2007 | Gorobets |
| 2007/0106679 A1 | 5/2007 | Perrin et al. |
| 2007/0113019 A1 | 5/2007 | Beukema et al. |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0156842 A1 | 7/2007 | Vermeulen et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0180346 A1 | 8/2007 | Murin |
| 2007/0191993 A1* | 8/2007 | Wyatt ............... G11C 5/00 700/299 |
| 2007/0201274 A1 | 8/2007 | Yu et al. |
| 2007/0204128 A1 | 8/2007 | Lee et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0245099 A1 | 10/2007 | Gray et al. |
| 2007/0263442 A1 | 11/2007 | Cornwall et al. |
| 2007/0268754 A1 | 11/2007 | Lee et al. |
| 2007/0277036 A1 | 11/2007 | Chamberlain et al. |
| 2007/0279988 A1 | 12/2007 | Nguyen |
| 2007/0291556 A1 | 12/2007 | Kamei |
| 2007/0294496 A1 | 12/2007 | Goss et al. |
| 2007/0300130 A1 | 12/2007 | Gorobets |
| 2008/0013390 A1 | 1/2008 | Zipprich-Rasch |
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0052451 A1 | 2/2008 | Pua et al. |
| 2008/0056005 A1 | 3/2008 | Aritome |
| 2008/0059602 A1 | 3/2008 | Matsuda et al. |
| 2008/0071971 A1 | 3/2008 | Kim et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112226 A1 | 5/2008 | Mokhlesi |
| 2008/0141043 A1 | 6/2008 | Flynn et al. |
| 2008/0144371 A1 | 6/2008 | Yeh et al. |
| 2008/0147714 A1 | 6/2008 | Breternitz et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0180084 A1 | 7/2008 | Dougherty et al. |
| 2008/0209282 A1 | 8/2008 | Lee et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |
| 2009/0003046 A1 | 1/2009 | Nirschl et al. |
| 2009/0003058 A1 | 1/2009 | Kang |
| 2009/0019216 A1 | 1/2009 | Yamada et al. |
| 2009/0031083 A1 | 1/2009 | Willis et al. |
| 2009/0037652 A1 | 2/2009 | Yu et al. |
| 2009/0070608 A1 | 3/2009 | Kobayashi |
| 2009/0116283 A1 | 5/2009 | Ha et al. |

(56) References Cited

U.S. PATENT DOCUMENTS

| | | |
|---|---|---|
| 2009/0125671 A1 | 5/2009 | Flynn et al. |
| 2009/0144598 A1 | 6/2009 | Yoon et al. |
| 2009/0158288 A1 | 6/2009 | Fulton et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0204823 A1 | 8/2009 | Giordano et al. |
| 2009/0207660 A1 | 8/2009 | Hwang et al. |
| 2009/0213649 A1 | 8/2009 | Takahashi et al. |
| 2009/0222708 A1 | 9/2009 | Yamaga |
| 2009/0228761 A1 | 9/2009 | Perlmutter et al. |
| 2009/0235128 A1 | 9/2009 | Eun et al. |
| 2009/0249160 A1 | 10/2009 | Gao et al. |
| 2009/0268521 A1 | 10/2009 | Ueno et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0310422 A1 | 12/2009 | Edahiro et al. |
| 2009/0319864 A1 | 12/2009 | Shrader |
| 2010/0002506 A1 | 1/2010 | Cho et al. |
| 2010/0008175 A1 | 1/2010 | Sweere et al. |
| 2010/0011261 A1 | 1/2010 | Cagno et al. |
| 2010/0020620 A1 | 1/2010 | Kim et al. |
| 2010/0037012 A1 | 2/2010 | Yano et al. |
| 2010/0054034 A1 | 3/2010 | Furuta et al. |
| 2010/0061151 A1 | 3/2010 | Miwa et al. |
| 2010/0091535 A1 | 4/2010 | Sommer et al. |
| 2010/0103737 A1 | 4/2010 | Park |
| 2010/0110798 A1 | 5/2010 | Hoei et al. |
| 2010/0115206 A1 | 5/2010 | de la Iglesia et al. |
| 2010/0118608 A1 | 5/2010 | Song et al. |
| 2010/0138592 A1 | 6/2010 | Cheon |
| 2010/0153616 A1 | 6/2010 | Garratt |
| 2010/0161936 A1 | 6/2010 | Royer et al. |
| 2010/0174959 A1 | 7/2010 | No et al. |
| 2010/0185807 A1 | 7/2010 | Meng et al. |
| 2010/0199027 A1 | 8/2010 | Pucheral et al. |
| 2010/0199125 A1 | 8/2010 | Reche |
| 2010/0199138 A1 | 8/2010 | Rho |
| 2010/0202196 A1 | 8/2010 | Lee et al. |
| 2010/0202239 A1 | 8/2010 | Moshayedi et al. |
| 2010/0208521 A1 | 8/2010 | Kim et al. |
| 2010/0257379 A1 | 10/2010 | Wang et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0306222 A1 | 12/2010 | Freedman et al. |
| 2010/0332858 A1 | 12/2010 | Trantham et al. |
| 2010/0332863 A1 | 12/2010 | Johnston |
| 2011/0010514 A1 | 1/2011 | Benhase et al. |
| 2011/0022779 A1 | 1/2011 | Lund et al. |
| 2011/0022819 A1 | 1/2011 | Post et al. |
| 2011/0051513 A1 | 3/2011 | Shen et al. |
| 2011/0066597 A1 | 3/2011 | Mashtizadeh et al. |
| 2011/0066806 A1 | 3/2011 | Chhugani et al. |
| 2011/0072207 A1 | 3/2011 | Jin et al. |
| 2011/0072302 A1 | 3/2011 | Sartore |
| 2011/0078407 A1 | 3/2011 | Lewis |
| 2011/0078496 A1 | 3/2011 | Jeddeloh |
| 2011/0083060 A1 | 4/2011 | Sakurada et al. |
| 2011/0099460 A1 | 4/2011 | Dusija et al. |
| 2011/0113281 A1 | 5/2011 | Zhang et al. |
| 2011/0122691 A1 | 5/2011 | Sprouse |
| 2011/0131444 A1 | 6/2011 | Buch et al. |
| 2011/0138260 A1 | 6/2011 | Savin |
| 2011/0173378 A1 | 7/2011 | Filor et al. |
| 2011/0179249 A1 | 7/2011 | Hsiao |
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0222342 A1 | 9/2011 | Yoon et al. |
| 2011/0225346 A1 | 9/2011 | Goss et al. |
| 2011/0228601 A1 | 9/2011 | Olbrich et al. |
| 2011/0231600 A1 | 9/2011 | Tanaka et al. |
| 2011/0239077 A1 | 9/2011 | Bai et al. |
| 2011/0264843 A1 | 10/2011 | Haines et al. |
| 2011/0271040 A1 | 11/2011 | Kamizono |
| 2011/0283119 A1 | 11/2011 | Szu et al. |
| 2011/0289125 A1 | 11/2011 | Guthery |
| 2011/0320733 A1 | 12/2011 | Sanford et al. |
| 2012/0011393 A1 | 1/2012 | Roberts et al. |
| 2012/0017053 A1 | 1/2012 | Yang et al. |
| 2012/0023144 A1 | 1/2012 | Rub |
| 2012/0026799 A1 | 2/2012 | Lee |
| 2012/0054414 A1 | 3/2012 | Tsai et al. |
| 2012/0063234 A1 | 3/2012 | Shiga et al. |
| 2012/0072639 A1 | 3/2012 | Goss et al. |
| 2012/0096217 A1 | 4/2012 | Son et al. |
| 2012/0110250 A1 | 5/2012 | Sabbag et al. |
| 2012/0117317 A1 | 5/2012 | Sheffler |
| 2012/0117397 A1* | 5/2012 | Kolvick ............... G06F 1/324 713/320 |
| 2012/0124273 A1 | 5/2012 | Goss et al. |
| 2012/0131286 A1 | 5/2012 | Faith et al. |
| 2012/0151124 A1 | 6/2012 | Baek et al. |
| 2012/0151253 A1 | 6/2012 | Horn |
| 2012/0151294 A1 | 6/2012 | Yoo et al. |
| 2012/0173797 A1 | 7/2012 | Shen |
| 2012/0173826 A1 | 7/2012 | Takaku |
| 2012/0185750 A1 | 7/2012 | Hayami |
| 2012/0195126 A1 | 8/2012 | Roohparvar |
| 2012/0203804 A1 | 8/2012 | Burka et al. |
| 2012/0203951 A1 | 8/2012 | Wood et al. |
| 2012/0210095 A1 | 8/2012 | Nellans et al. |
| 2012/0216079 A1 | 8/2012 | Fai et al. |
| 2012/0233391 A1 | 9/2012 | Frost et al. |
| 2012/0236658 A1 | 9/2012 | Byom et al. |
| 2012/0239858 A1 | 9/2012 | Melik-Martirosian |
| 2012/0239868 A1 | 9/2012 | Ryan et al. |
| 2012/0239976 A1 | 9/2012 | Cometti et al. |
| 2012/0246204 A1 | 9/2012 | Nalla et al. |
| 2012/0259863 A1 | 10/2012 | Bodwin et al. |
| 2012/0275466 A1 | 11/2012 | Bhadra et al. |
| 2012/0278564 A1 | 11/2012 | Goss et al. |
| 2012/0284574 A1 | 11/2012 | Avila et al. |
| 2012/0284587 A1 | 11/2012 | Yu et al. |
| 2013/0007073 A1 | 1/2013 | Varma |
| 2013/0007343 A1 | 1/2013 | Rub et al. |
| 2013/0007381 A1 | 1/2013 | Palmer |
| 2013/0007543 A1 | 1/2013 | Goss et al. |
| 2013/0024735 A1 | 1/2013 | Chung et al. |
| 2013/0031438 A1 | 1/2013 | Hu et al. |
| 2013/0036418 A1 | 2/2013 | Yadappanavar et al. |
| 2013/0038380 A1 | 2/2013 | Cordero et al. |
| 2013/0047045 A1 | 2/2013 | Hu et al. |
| 2013/0058145 A1 | 3/2013 | Yu et al. |
| 2013/0070527 A1 | 3/2013 | Sabbag et al. |
| 2013/0073784 A1 | 3/2013 | Ng et al. |
| 2013/0073798 A1 | 3/2013 | Kang et al. |
| 2013/0073924 A1 | 3/2013 | D'Abreu et al. |
| 2013/0079942 A1 | 3/2013 | Smola et al. |
| 2013/0086131 A1 | 4/2013 | Hunt et al. |
| 2013/0086132 A1 | 4/2013 | Hunt et al. |
| 2013/0094288 A1 | 4/2013 | Patapoutian et al. |
| 2013/0103978 A1 | 4/2013 | Akutsu |
| 2013/0111279 A1 | 5/2013 | Jeon et al. |
| 2013/0111298 A1 | 5/2013 | Seroff et al. |
| 2013/0117606 A1 | 5/2013 | Anholt et al. |
| 2013/0121084 A1 | 5/2013 | Jeon et al. |
| 2013/0124792 A1 | 5/2013 | Melik-Martirosian et al. |
| 2013/0124888 A1 | 5/2013 | Tanaka et al. |
| 2013/0128666 A1 | 5/2013 | Avila et al. |
| 2013/0132647 A1 | 5/2013 | Melik-Martirosian |
| 2013/0132652 A1 | 5/2013 | Wood et al. |
| 2013/0159609 A1 | 6/2013 | Haas et al. |
| 2013/0176784 A1 | 7/2013 | Cometti et al. |
| 2013/0179646 A1 | 7/2013 | Okubo et al. |

(56) References Cited

U.S. PATENT DOCUMENTS

| | | | |
|---|---|---|---|
| 2013/0191601 A1 | 7/2013 | Peterson et al. | |
| 2013/0194865 A1 | 8/2013 | Bandic et al. | |
| 2013/0194874 A1 | 8/2013 | Mu et al. | |
| 2013/0232289 A1 | 9/2013 | Zhong et al. | |
| 2013/0238576 A1 | 9/2013 | Binkert et al. | |
| 2013/0254498 A1 | 9/2013 | Adachi et al. | |
| 2013/0254507 A1 | 9/2013 | Islam et al. | |
| 2013/0258738 A1 | 10/2013 | Barkon et al. | |
| 2013/0265838 A1 | 10/2013 | Li | |
| 2013/0282955 A1 | 10/2013 | Parker et al. | |
| 2013/0290611 A1 | 10/2013 | Biederman et al. | |
| 2013/0297613 A1 | 11/2013 | Yu | |
| 2013/0301373 A1 | 11/2013 | Tam | |
| 2013/0304980 A1 | 11/2013 | Nachimuthu et al. | |
| 2013/0343131 A1 | 12/2013 | Wu et al. | |
| 2013/0346672 A1 | 12/2013 | Sengupta et al. | |
| 2014/0013027 A1 | 1/2014 | Venkata et al. | |
| 2014/0013188 A1 | 1/2014 | Wu et al. | |
| 2014/0025864 A1 | 1/2014 | Zhang et al. | |
| 2014/0032890 A1* | 1/2014 | Lee | G06F 9/4401 713/2 |
| 2014/0063905 A1 | 3/2014 | Ahn et al. | |
| 2014/0067761 A1 | 3/2014 | Chakrabarti et al. | |
| 2014/0075133 A1 | 3/2014 | Li et al. | |
| 2014/0082261 A1 | 3/2014 | Cohen et al. | |
| 2014/0082310 A1 | 3/2014 | Nakajima | |
| 2014/0082456 A1 | 3/2014 | Li et al. | |
| 2014/0095775 A1 | 4/2014 | Talagala et al. | |
| 2014/0101389 A1 | 4/2014 | Nellans et al. | |
| 2014/0115238 A1 | 4/2014 | Xi et al. | |
| 2014/0122818 A1 | 5/2014 | Hayasaka et al. | |
| 2014/0122907 A1 | 5/2014 | Johnston | |
| 2014/0136762 A1 | 5/2014 | Li et al. | |
| 2014/0136883 A1 | 5/2014 | Cohen | |
| 2014/0136927 A1 | 5/2014 | Li et al. | |
| 2014/0143505 A1 | 5/2014 | Sim et al. | |
| 2014/0157065 A1 | 6/2014 | Ong | |
| 2014/0173224 A1 | 6/2014 | Fleischer et al. | |
| 2014/0181458 A1 | 6/2014 | Loh et al. | |
| 2014/0201596 A1 | 7/2014 | Baum et al. | |
| 2014/0223084 A1 | 8/2014 | Lee et al. | |
| 2014/0244578 A1* | 8/2014 | Winkelstraeter | G06F 11/1435 707/617 |
| 2014/0258755 A1 | 9/2014 | Stenfort | |
| 2014/0269090 A1 | 9/2014 | Flynn et al. | |
| 2014/0310494 A1 | 10/2014 | Higgins et al. | |
| 2014/0359381 A1 | 12/2014 | Takeuchi et al. | |
| 2015/0023097 A1 | 1/2015 | Khoueir et al. | |
| 2015/0032967 A1 | 1/2015 | Udayashankar et al. | |
| 2015/0037624 A1* | 2/2015 | Thompson | H01M 10/425 429/50 |
| 2015/0153799 A1 | 6/2015 | Lucas et al. | |
| 2015/0153802 A1 | 6/2015 | Lucas et al. | |
| 2015/0212943 A1 | 7/2015 | Yang et al. | |
| 2015/0268879 A1 | 9/2015 | Chu | |
| 2015/0286438 A1 | 10/2015 | Simionescu et al. | |

FOREIGN PATENT DOCUMENTS

| | | |
|---|---|---|
| EP | 1 990 921 A2 | 11/2008 |
| EP | 2 386 958 A1 | 11/2011 |
| EP | 2 620 946 A2 | 7/2013 |
| JP | 2002-532806 S | 10/2002 |
| WO | WO 2007/036834 A2 | 4/2007 |
| WO | WO 2007/080586 A2 | 7/2007 |
| WO | WO 2008/075292 | 6/2008 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |
| WO | WO 2011/024015 | 3/2011 |

OTHER PUBLICATIONS

Office Action dated Jul. 31, 2015, received in Chinese Patent Application No. 201180021660.2, which corresponds to U.S. Appl. No. 12/726,200, 9 pages (Olbrich).

International Search Report and Written Opinion dated Jul. 23, 2015, received in International Patent Application No. PCT/US2015/030850, which corresponds to U.S. Appl. No. 14/298,843, 12 pages (Ellis).

International Search Report and Written Opinion dated Sep. 14, 2015, received in International Patent Application No. PCT/US2015/036807, which corresponds to U.S. Appl. No. 14/311,152, 9 pages (Higgins).

IBM Research-Zurich, "The Fundamental Limit of Flash Random Write Performance: Understanding, Analysis and Performance Modeling," Mar. 31, 2010, pp. 1-15.

Bayer, "Prefix B-Trees", Ip.com Journal, Ip.com Inc., West Henrietta, NY, Mar. 30, 2007, 29 pages.

Bhattacharjee et al., "Efficient Index Compression in DB2 LUW", IBM Research Report, Jun. 23, 2009, http://domino.research.ibm.com/library/cyberdig.nsf/papers/40B2C45876D0D747852575E100620CE7/$File/rc24815.pdf, 13 pages.

Oracle, "Oracle9i: Database Concepts", Jul. 2001, http://docs.oracle.com/cd/A91202_01/901_doc/server.901/a88856.pdf, 49 pages.

International Search Report and Written Opinion dated Jun. 8, 2015, received in International Patent Application No. PCT/US2015/018252, which corresponds to U.S. Appl. No. 14/339,072, 9 pages (Busch).

International Search Report and Written Opinion dated Jun. 2, 2015, received in International Patent Application No. PCT/US2015/018255, which corresponds to U.S. Appl. No. 14/336,967, 14 pages. (Chander).

International Search Report and Written Opinion dated Jun. 30, 2015, received in International Patent Application No. PCT/US2015/023927, which corresponds to U.S. Appl. No. 14/454,687, 11 pages (Kadayam).

Invitation to Pay Additional Fees dated Feb. 13, 2015, received in International Patent Application No. PCT/US2014/063949, which corresponds to U.S. Appl. No. 14/135,433, 6 pages (Delpapa).

International Search Report and Written Opinion dated Jan. 21, 2015, received in International Application No. PCT/US2014/059748, which corresponds to U.S. Appl. No. 14/137,511, 13 pages (Dancho).

International Search Report and Written Opinion dated Feb. 18, 2015, received in International Application No. PCT/US2014/066921, which corresponds to U.S. Appl. No. 14/135,260, 13 pages (Fitzpatrick).

International Search Report and Written Opinion dated Jul. 25, 2014, received in International Patent Application No. PCT/US2014/029453, which corresponds to U.S. Appl. No. 13/963,444, 9 pages (Frayer).

International Search Report and Written Opinion dated Mar. 7, 2014, received in International Patent Application No. PCT/US2013/074772, which corresponds to U.S. Appl. No. 13/831,218, 10 pages (George).

International Search Report and Written Opinion dated Mar. 24, 2014, received in International Patent Application No. PCT/US2013/074777, which corresponds to U.S. Appl. No. 13/831,308, 10 pages (George).

International Search Report and Written Opinion dated Mar. 7, 2014, received in International Patent Application No. PCT/US2013/074779, which corresponds to U.S. Appl. No. 13/831,374, 8 pages (George).

Ashkenazi et al., "Platform independent overall security architecture in multi-processor system-on-chip integrated circuits for use in mobile phones and handheld devices," ScienceDirect, Computers and Electrical Engineering 33 (2007), 18 pages.

Lee et al., "A Semi-Preemptive Garbage Collector for Solid State Drives," Apr. 2011, IEEE, pp. 12-21.

(56) References Cited

OTHER PUBLICATIONS

Office Action dated Feb. 17, 2015, received in Chinese Patent Application No. 201210334987.1, which corresponds to U.S. Appl. No. 12/082,207, 9 pages (Prins).
International Search Report and Written Opinion dated May 4, 2015, received in International Patent Application No. PCT/US2014/065987, which corresponds to U.S. Appl. No. 14/135,400, 12 pages (George).
International Search Report and Written Opinion dated Mar. 17, 2015, received in International Patent Application No. PCT/US2014/067467, which corresponds to U.S. Appl. No. 14/135,420, 13 pages (Lucas).
International Search Report and Written Opinion dated Apr. 20, 2015, received in International Patent Application No. PCT/US2014/063949, which corresponds to U.S. Appl. No. 14/135,433, 21 pages (Delpapa).
International Search Report and Written Opinion dated Mar. 9, 2015, received in International Patent Application No. PCT/US2014/059747, which corresponds to U.S. Appl. No. 14/137,440, 9 pages (Fitzpatrick).
Barr, Introduction to Watchdog Timers, Oct. 2001, 3 pgs.
Canim, Buffered Bloom ilters on Solid State Storage, ADMS* 10, Singapore, Sep. 13-17, 2010, 8 pgs.
Kang, A Multi-Channel Architecture for High-Performance NAND Flash-Based Storage System, J. Syst. Archit., 53, 9, Sep. 2007, 15 pgs.
Kim, A Space-Efficient Flash Translation Layer for CompactFlash Systems, May 2002, 10 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
McLean, Information Technology-AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.
Pliant Technology, International Search Report / Written Opinion, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
Sandisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
Gasior, "Gigabyte's i-Ram storage device, Ram disk without the fuss," The Tech Report, p. 1, Jan. 25, 2006, 5 pages.
Oestreicher et al., "Object Lifetimes in Java Card," 1999, USENIX, 10 pages.
International Preliminary Report on Patentability dated May 24, 2016, received in International Patent Application No. PCT/US2014/065987, which corresponds to U.S. Appl. No. 14/135,400, 9 pages (George).

* cited by examiner

DIMM DEVICE CONTROLLER SUPERVISOR

RELATED APPLICATIONS

This application claims priority to U.S. Provisional Patent Application No. 61/909,939, filed Nov. 27, 2013, which is hereby incorporated by reference in its entirety.

TECHNICAL FIELD

The disclosed embodiments relate generally to memory systems, and in particular, to performing supervisory functions in memory devices.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information.

Such memory devices require a controller to log and monitor performance information of the storage device, and to perform one or more operations to ensure nominal performance of the storage device. These operations are important for proper housekeeping, control and reporting of problems encountered by the storage device, as modern memory devices must operate in varied power and environmental conditions.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to enable performing supervisory functions in memory devices.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
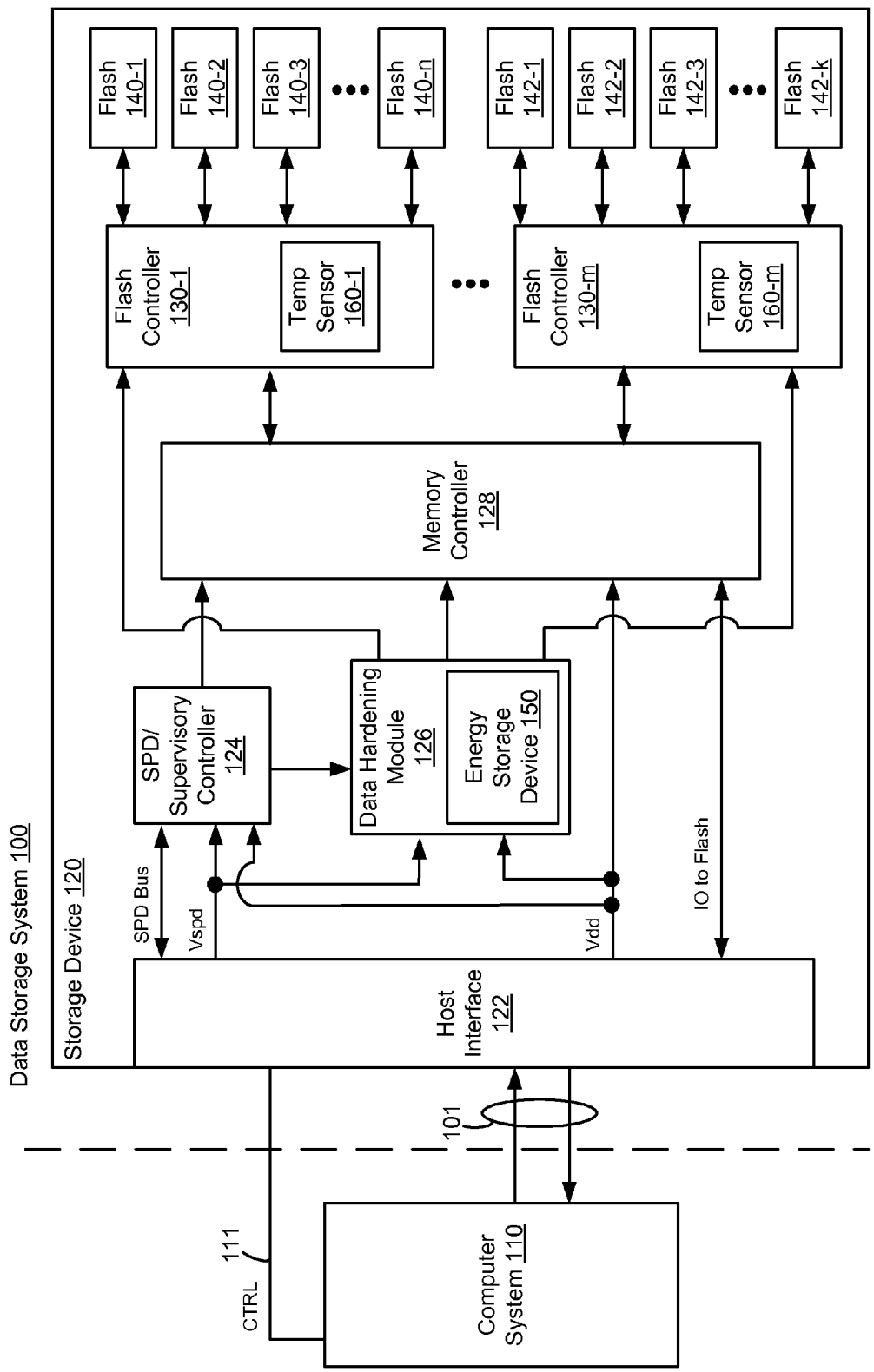
FIG. 1 is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to perform supervisory functions in memory devices. More specifically, some implementations include a method of performing supervisory functions for a dual in-line memory module (DIMM). In some implementations, the method includes, at a controller in the DIMM, determining, upon power-up, a power supply voltage provided to the DIMM. The method further includes performing operations, in accordance with a determination that the power supply criteria are satisfied, where the power supply criteria include a requirement that a power supply voltage provided to the DIMM falls within one of N predefined voltage ranges, and N is an integer greater than one. In some embodiments, these operations responsive to a determination that the power supply criteria are satisfied include: performing one or more power-up operations, including initiating a usage counter, monitoring a temperature of the DIMM, monitoring the DIMM for occurrence of one or more of a set of predetermined trigger events, and in response to detecting one of the set of predetermined trigger events, logging information corresponding to the detected predetermined event.

In some embodiments, the set of predetermined events includes two or more of: a temperature measurement of the DIMM in excess of a predefined temperature, a power failure condition, a predefined condition corresponding to a predefined command received from a host, a current number of program-erase cycles performed on respective flash memory portions of the DIMM matches predefined criteria.

In some embodiments, the power supply criteria further include a requirement that a SPD supply voltage provided to the DIMM is a predefined SPD supply voltage.

In some embodiments, the method further includes, in accordance with a determination that power supply criteria are not satisfied, performing one or more lock-out functions.

In some embodiments, performing the one or more power-up operations includes: in accordance with a determination that the power supply voltage provided to the DIMM is a first predefined voltage, executing a memory module function using a first set of configuration parameters corresponding to the first predefined voltage, and in accordance with a determination that the power supply voltage provided to the DIMM is a second predefined voltage, executing the memory module function using a second set of configuration parameters corresponding to the second predefined voltage.

In some embodiments, the method further includes, in response to receiving a command from a host system, replacing the first set of configuration parameters.

In some embodiments, performing the one or more power-up operations includes de-asserting a reset applied to one or more non-volatile memory controllers in the DIMM.

In some embodiments, the method further includes monitoring a charge of an energy storage device in a data hardening module.

In some embodiments, a value of the usage counter is a current sum of time accumulated since power-up.

In some embodiments, the method further includes determining an accelerated time measurement based at least in part on the value of the usage counter and the monitored temperature of the DIMM.

In some embodiments, the method further includes, in response to detecting one of the set of events, sending a notification to a host system.

In some embodiments, the method further includes receiving a request for information from a host system, and in response to the request, sending the host system the requested information.

In some embodiments, the controller in the DIMM is coupled using serial presence detect (SPD) pins, with an interface for the DIMM, wherein the interface for the DIMM is configured to be coupled with a memory bus.

In another aspect, any of the methods described above are performed by a dual in-line memory module (DIMM) device comprising (1) an interface for coupling the DIMM device to a host system, and (2) a controller in the DIMM, of a plurality of controllers, where the controller is configured to: (a) upon power-up, determine a power supply voltage provided to the DIMM, and (b) in accordance with a determination that power supply criteria are satisfied, the power supply criteria including a requirement that a power supply voltage provided to the DIMM falls within one of N predefined voltage ranges, wherein N is an integer greater than one: (i) perform one or more power-up operations, including initiating a usage counter, (ii) monitor a temperature of the DIMM, (iii) monitor the DIMM for occurrence of one or more of a set of predetermined trigger events, and (iv) in response to detecting one of the set of predetermined trigger events, log information corresponding to the detected predetermined event.

In some embodiments, the dual in-line memory module (DIMM) device is configured to perform any of the methods described above.

In some embodiments, the plurality of controllers on the dual in-line memory module (DIMM) device include at least one non-volatile memory controller and at least one other memory controller other than the at least one non-volatile memory controller.

In some embodiments, one of the plurality of controllers on the storage device maps double data rate (DDR) interface commands to serial advance technology attachment (SATA) interface commands.

In yet another aspect, any of the methods described above are performed by a dual in-line memory module (DIMM) device operable to perform supervisory functions. In some embodiments, the device includes (1) an interface for coupling the DIMM device to a host system, (2) means for determining, upon power-up, a power supply voltage provided to the DIMM, and (3) monitoring means for performing a set of operations in accordance with a determination that power supply criteria are satisfied, the power supply criteria including a requirement that a power supply voltage provided to the DIMM falls within one of N predefined voltage ranges, wherein N is an integer greater than one. The monitoring means include: (a) means for performing one or more power-up operations, including initiating a usage counter, (b) means for monitoring a temperature of the DIMM, (c) means for monitoring the DIMM for occurrence of one or more of a set of predetermined trigger events, and (d) means for logging information corresponding to the detected predetermined event in response to detecting one of the set of predetermined trigger events.

In yet another aspect, a non-transitory computer readable storage medium, storing one or more programs for execution by one or more processors of a storage device having a plurality of controllers, the one or more programs including instructions for performing any of the methods described above.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a block diagram illustrating an implementation of a data storage system 100, in accordance with some embodiments. While some example features are illustrated, various other features have not been illustrated for the sake of brevity and so as not to obscure more pertinent aspects of the example implementations disclosed herein. To that end, as a non-limiting example, data storage system 100 includes storage device 120 (sometimes called a memory module, memory device, data storage device or information storage device), which includes host interface 122, serial presence detect (SPD)/supervisory controller 124, data hardening module 126, memory controller 128, one or more flash controllers (e.g., flash controller(s) 130), and non-volatile memory (e.g., one or more flash memory device(s) 140, 142), and is used in conjunction with computer system 110. In some implementations, storage device 120 includes a single flash memory device while in other implementations storage device 120 includes a plurality of flash memory devices. In some implementations, flash memory devices 140, 142 include NAND-type flash memory or NOR-type flash memory. Further, in some implementations, flash controller 130 is a solid-state drive (SSD) controller. However, one or more other types of storage media may be included in accordance with aspects of a wide variety of implementations.

Computer system 110 is coupled to storage device 120 through data connections 101. However, in some implementations computer system 110 includes storage device 120 as a component and/or sub-system. Computer system 110 may be any suitable computer device, such as a personal computer, a workstation, a computer server, or any other computing device. Computer system 110 is sometimes called a host or host system. In some implementations, computer system 110 includes one or more processors, one or more types of memory, optionally includes a display and/or other user interface components such as a keyboard, a touch screen display, a mouse, a track-pad, a digital camera and/or any number of supplemental devices to add functionality. Further, in some implementations, computer system 110 sends one or more host commands (e.g., read commands and/or write commands) on control line 111 to storage device 120. In some implementations, computer system 110 is a server system, such as a server system in a data center, and does not have a display and other user interface components.

In some implementations, storage device 120 includes flash memory devices 140, 142 (e.g., flash memory devices 140-1 through 140-$n$ and flash memory devices 142-1 through 142-k) and flash controllers 130 (e.g., flash controllers 130-1 through 130-m). In some implementations, each flash controller of flash controllers 130 include one or more processing units (also sometimes called CPUs or processors or microprocessors or microcontrollers) configured to execute instructions in one or more programs (e.g., in flash controllers 130). In some implementations, the one or more processors are shared by one or more components within, and in some cases, beyond the function of flash controllers 130. In some implementations, each flash controller of flash controllers 130 includes one or more temperature sensors 160 configured to measure the temperature of a respective flash controller of flash controllers 130. Flash memory devices 140, 142 are coupled to flash controllers 130 through connections that typically convey commands in addition to data, and optionally convey metadata, error correction information and/or other information in addition to data values to be stored in flash memory devices 140, 142 and data values read from flash memory devices 140, 142. For example, flash memory devices 140, 142 can be configured for enterprise storage suitable for applications such as cloud computing, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers. Although flash memory devices and flash controllers are used as an example here, storage device 120 may include any other non-volatile memory device(s) and corresponding non-volatile memory controller(s).

In some implementations, storage device 120 also includes host interface 122, SPD/supervisory controller 124, data hardening module 126, and memory controller 128. Storage device 120 may include various additional features that have not been illustrated for the sake of brevity and so as not to obscure more pertinent features of the example implementations disclosed herein, and a different arrangement of features may be possible. Host interface 122 provides an interface to computer system 110 through data connections 101. In some implementations, SPD/supervisory controller 124 is coupled with host interface 122 through an SPD bus, to the SPD pins of host interface 122.

In some implementations, data hardening module 126 includes one or more processing units (also sometimes called CPUs or processors or microprocessors or microcontrollers) configured to execute instructions in one or more programs (e.g., in data hardening module 126). In some implementations, the one or more processors are shared by one or more components within, and in some cases, beyond the function of data hardening module 126. Data hardening module 126 is coupled to host interface 122, SPD/supervisory controller 124, memory controller 128, and flash controllers 130. Data hardening module 126 comprises energy storage device 150. In some embodiments, energy storage device 150 includes one or more capacitors. In other embodiments, energy storage device 150 includes one or more inductors or any other passive elements that store energy. In some embodiments, energy storage device 150 includes one or more batteries. In some embodiments, a power fail operation is performed using power from energy storage device 150 on the storage device 120. During a power fail operation, the energy storage device 150 is used to provide power to the storage device 120, and data hardening module 126 is used to connect and disconnect the appropriate power sources to preserve data.

Memory controller 128 is coupled to host interface 122, data hardening module 126, SPD/supervisory controller 124 and flash controllers 130. In some implementations, during a write operation, memory controller 128 receives data from computer system 110 through host interface 122 and during a read operation, memory controller 128 sends data to computer system 110 through host interface 122. Further, host interface 122 provides additional data, signals, voltages, and/or other information needed for communication between memory controller 128 and computer system 110. In some embodiments, memory controller 128 and host interface 122 use a defined interface standard for communication, such as double data rate type three synchronous dynamic random access memory (DDR3). In some embodiments, memory controller 128 and flash controllers 130 use a defined interface standard for communication, such as serial advance technology attachment (SATA). In some other implementations, the device interface used by memory controller 128 to communicate with flash controllers 130 is SAS (serial attached SCSI), or other storage interface. In some implementations, memory controller 128 includes one or more processing units (also sometimes called CPUs or processors or microprocessors or microcontrollers) configured to execute instructions in one or more programs (e.g., in memory controller 128). In some implementations, the one or more processors are shared by one or more components within, and in some cases, beyond the function of memory controller 128.

SPD/supervisory controller 124 is coupled to host interface 122, data hardening module 126 and memory controller 128. Serial presence detect (SPD) refers to a standardized way to automatically access information about a computer memory module (e.g., storage device 120). For example, if the memory module has a failure, the failure can be communicated with a host system (e.g., computer system 110) through SPD/supervisory controller 124. In some embodiments, the SPD/supervisory controller 124 is one block with the combined functions of conventional SPD devices (e.g., EEPROM memory storing memory device parameters), and the disclosed supervisory controller. In some embodiments, the SPD/supervisory controller 124 is two or more blocks residing on a single SPD bus coupled with the host interface 122.

Figure 2:
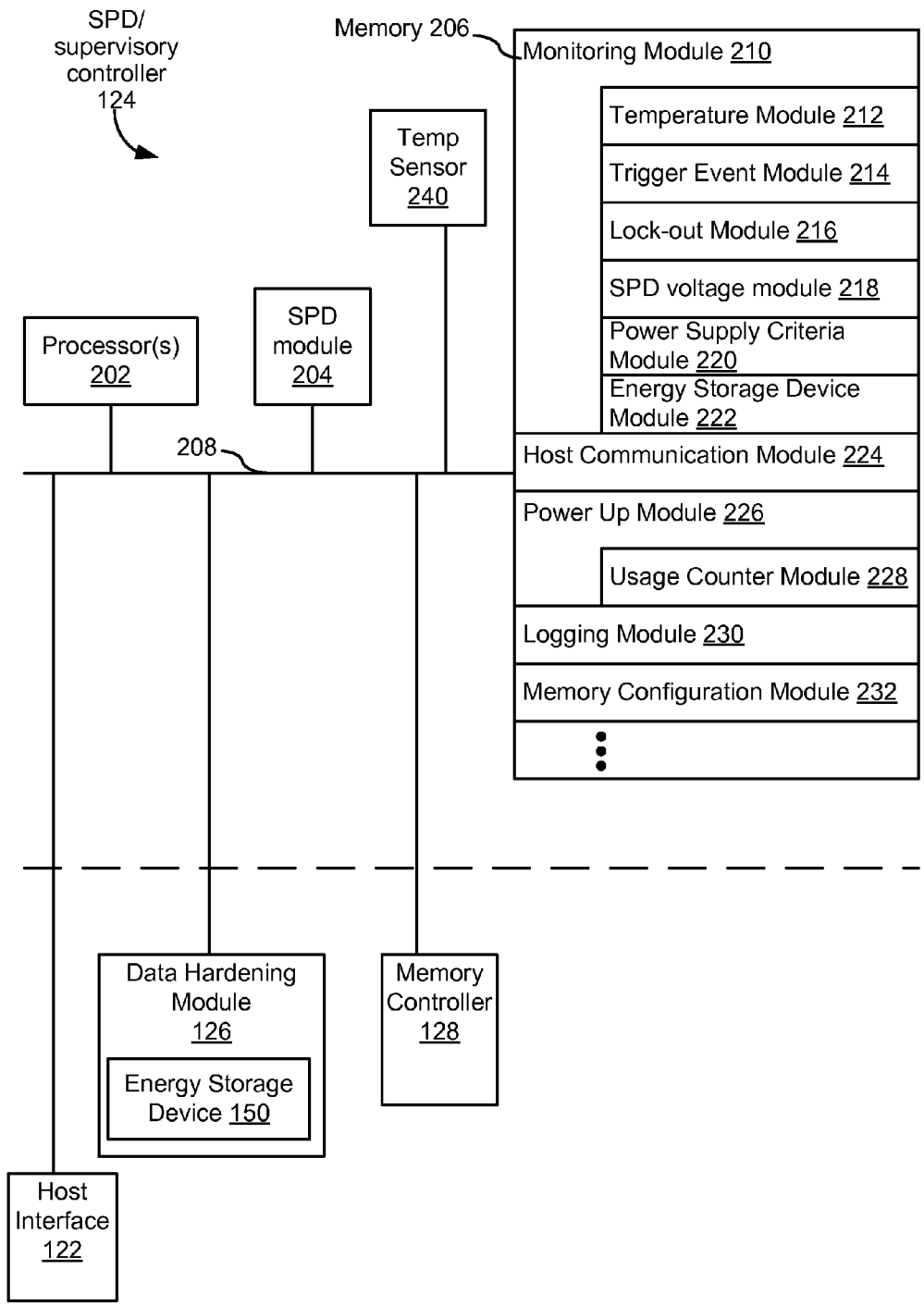
FIG. 2 is a block diagram illustrating an implementation of a supervisory controller, in accordance with some embodiments.

FIG. 2 is a block diagram illustrating an implementation of SPD device/supervisory controller 124, in accordance with some embodiments. SPD device/supervisory controller 124 typically includes one or more processors (also sometimes called CPUs or processing units or microprocessors or microcontrollers) 202 for executing modules, programs and/or instructions stored in memory 206 and thereby performing processing operations, memory 206, SPD module 204, and one or more communication buses 208 for interconnecting these components. In some implementations, SPD module 204 is a conventional SPD device (e.g., EEPROM memory storing memory device parameters) and is coupled with the SPD pins of host interface 122 through one or more communication buses 208. In some embodiments, SPD/supervisory controller 124 also comprises a temperature sensor 240. In some embodiments, the temperature sensor 240 is located on the DIMM device (e.g., storage device 120, FIG. 1) outside of the SPD/supervisory controller 124, but remains communicatively coupled with SPD/supervisory controller 124.

Communication buses 208 optionally include circuitry (sometimes called a chipset) that interconnects and controls communications between system components. SPD device/supervisory controller 124 is coupled to host interface 122, data hardening module 126 and memory controller 128 by communication buses 208. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from processor(s) 202. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset thereof:

- a monitor module 210 that is used for monitoring temperature sensors, trigger events, lock-out conditions, SPD voltage, power supply criteria and the charge of an energy storage device 150 for a storage device (e.g., storage device 120, FIG. 1);
- a host communication module 224 that is used for managing incoming and outgoing communications with the host (e.g., computer system 110, FIG. 1);
- a power-up module 226 that is used for performing one or more power-up operations of the storage device;
- a logging module 230 that is used for logging information corresponding to the occurrence of one or more predetermined trigger events on the DIMM device; and
- a memory configuration module 232 that is used for executing one or more memory module functions using one or more sets of configuration parameters.

In some embodiments, the monitoring module 210 optionally includes the following modules or sub-modules, or a subset thereof:

- a temperature module 212 that is used for monitoring the temperature readings of the DIMM device (e.g., using a thermocouple on the DIMM device);
- a trigger event module 214 that is used for monitoring the DIMM for occurrence of one or more of a set of predetermined trigger events;
- a lock-out module 216 that is used for performing one or more lock-out functions in response to monitoring the status of power supply criteria on the DIMM device;
- a SPD voltage module 218 that is used for monitoring characteristics of an SPD voltage provided to the storage device; and
- an energy storage device module 222 that is used for monitoring the charge level on the energy storage device of a data hardening module (e.g., energy storage device 150 in data hardening module 126) on the DIMM device.

In some embodiments, the power-up module 226 optionally includes a usage counter module 212 that is used for measuring a value of elapsed time since power-up of the DIMM device.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing any of the methods described below with reference to FIGS. 3A-3C.

Although FIG. 2 shows SPD/supervisory controller 126, FIG. 2 is intended more as a functional description of the various features which may be present in a SPD/supervisory controller than as a structural schematic of the embodiments described herein. In practice, and as recognized by those of ordinary skill in the art, items shown separately could be combined and some items could be separated.

Figure 3A:
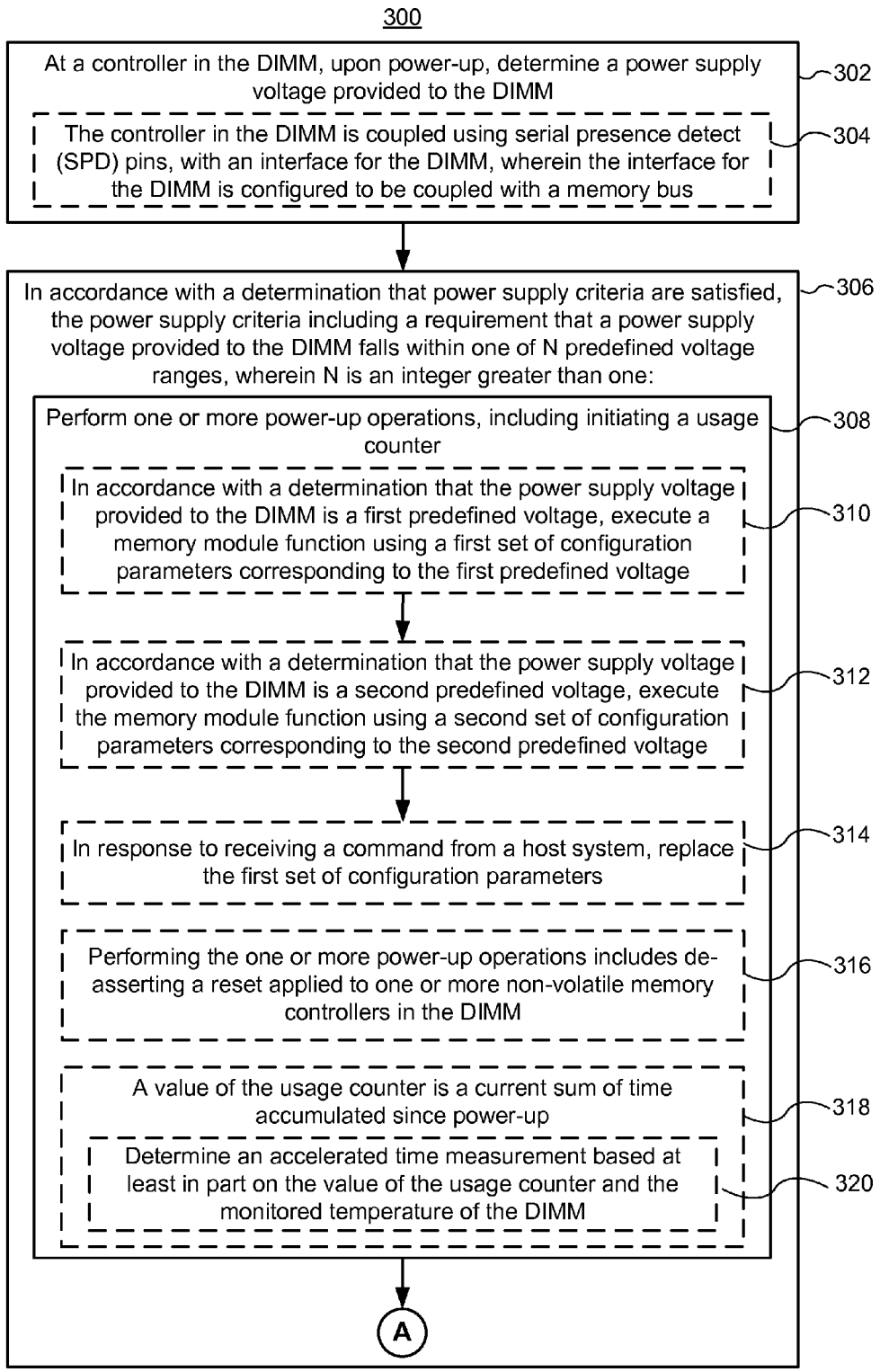
FIGS. 3A-3C illustrate a flowchart representation of a method of performing supervisory functions in a storage device, in accordance with some embodiments.
Figure 3B:
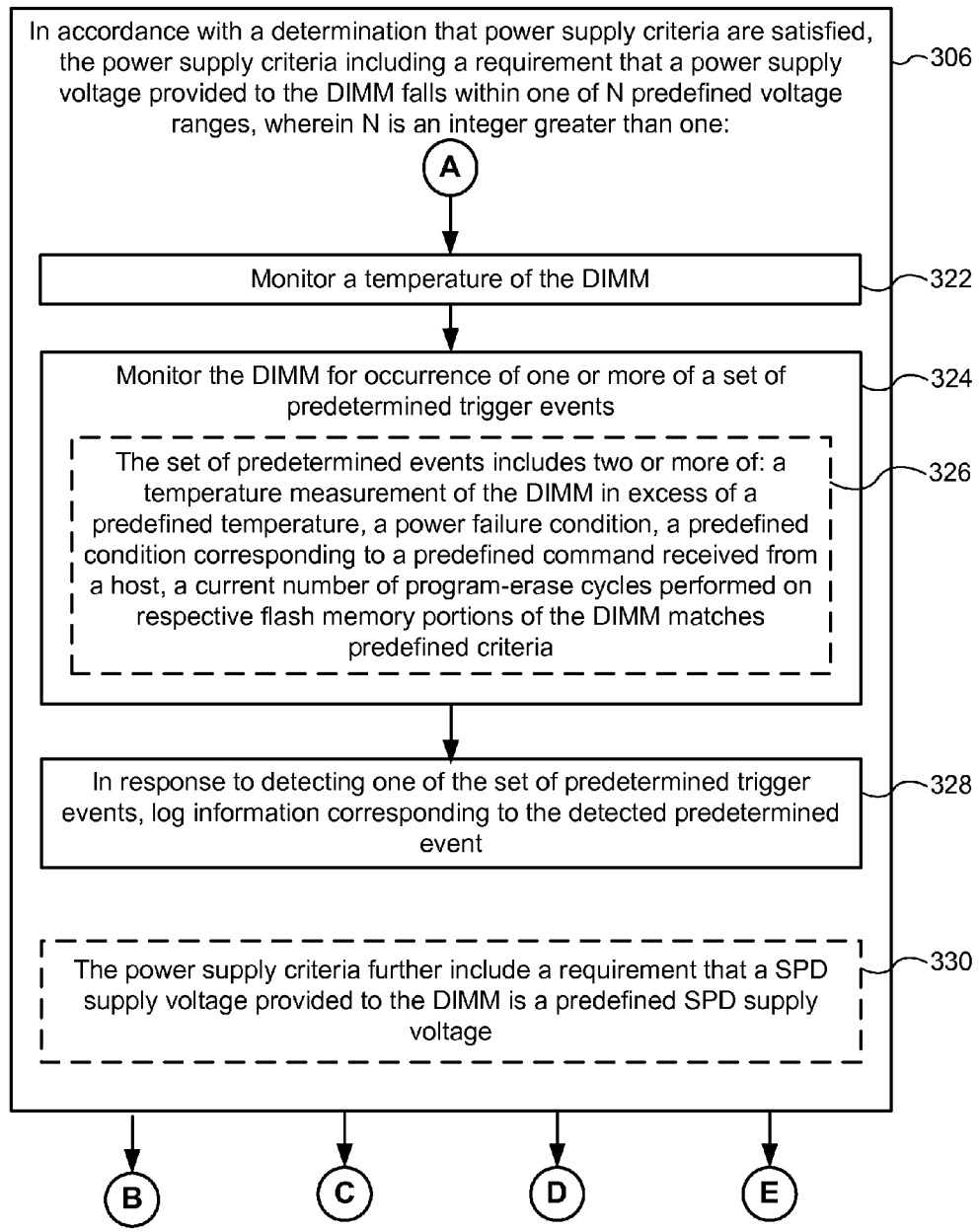
Figure 3C:
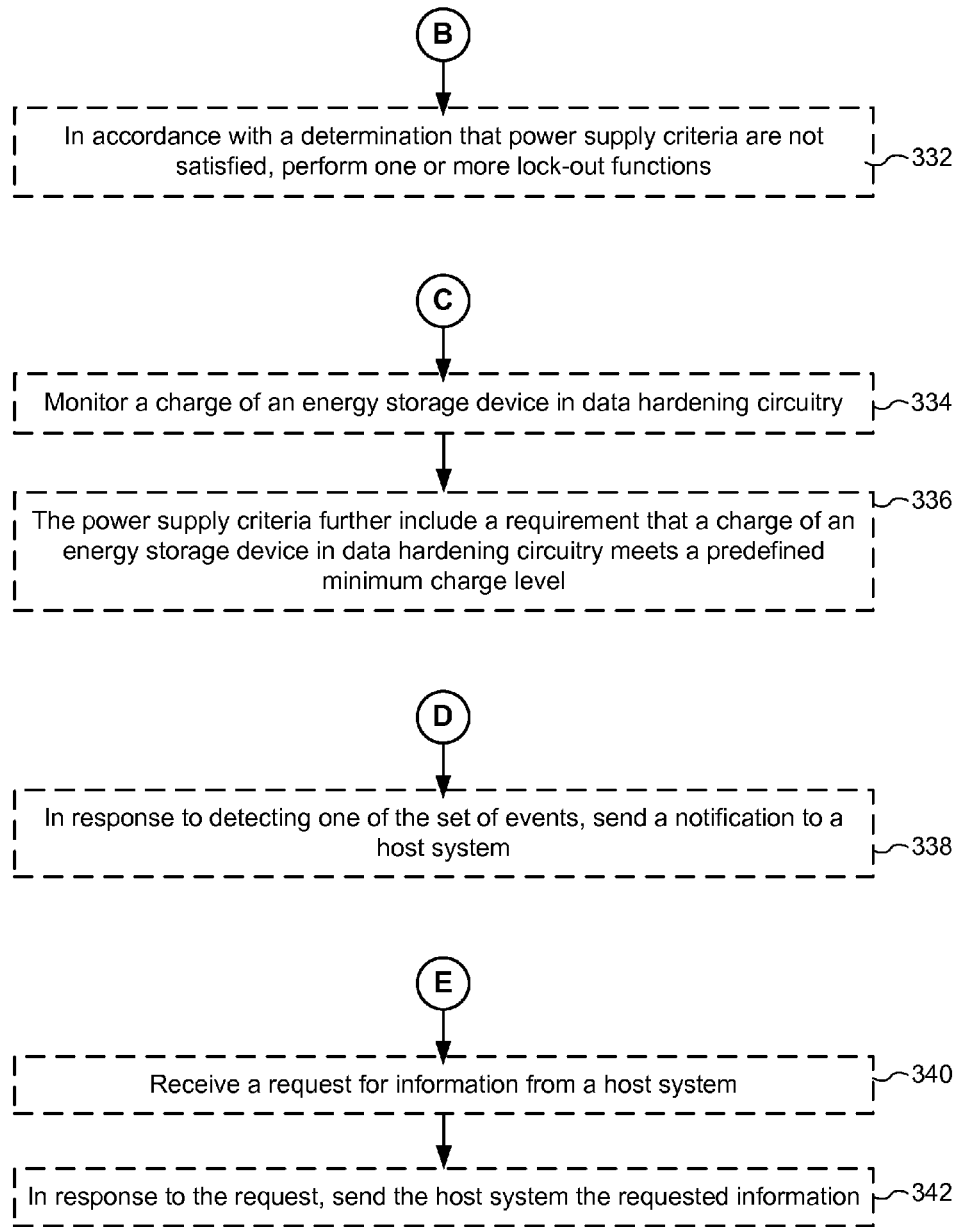

FIGS. 3A-3C illustrate a flowchart representation of a method 300 of performing supervisory functions at a controller in a storage device (e.g., a dual in-line memory module, such as storage device 120). A storage device (e.g., storage device 120, FIG. 1) coordinates and manages multiple sub-system components to protect data, which initiates performance of method 300. At least in some implementations, method 300 is performed by a storage device (e.g., storage device 120, FIG. 1) or one or more components of the storage device (e.g., SPD/supervisory controller 124, memory controller 128, and/or flash controllers 130, FIG. 1). In some embodiments, method 300 is governed by instructions that are stored in a non-transitory computer readable storage medium and that are executed by one or more processors of a device, such as the one or more processors 202 of SPD/supervisory controller 124, one or more processors of memory controller 128, and/or one or more processors of flash controllers 130.

At a controller (e.g., SPD/supervisory controller 124, FIG. 1) of a DIMM device (e.g., storage device 120, FIG. 1), the DIMM device determines (302) a power supply voltage provided to the DIMM. In some embodiments, the controller in the DIMM is coupled (304) using serial presence detect (SPD) pins, with an interface for the DIMM, wherein the interface for the DIMM is configured to be coupled with a memory bus (e.g., host interface 122, FIG. 1).

Next, the storage device, performs (306) operations in accordance with a determination that power supply criteria are satisfied, the power supply criteria including a requirement that a power supply voltage provided to the DIMM falls within one of N predefined voltage ranges, wherein N is an integer greater than one. For example, the power supply criteria may include a requirement that the power supply voltage provided to the DIMM must fall within +/−10% of 1.5V, or fall within +/−10% of 1.35V. The storage device performs (308) one or more power-up operations, including initiating a usage counter.

In some embodiments, in accordance with a determination that the power supply voltage provided to the DIMM is a first predefined voltage (e.g., 1.2V), the DIMM device executes (310) a memory module function (e.g., read, write, erase, send message to host) using a first set of configuration parameters (e.g., changing configuration bits or updating firmware) corresponding to the first predefined voltage. Furthermore, in accordance with a determination that the power supply voltage provided to the DIMM is a second predefined voltage (e.g., 1.4V), the DIMM device executes (312) the memory module function using a second set of configuration parameters corresponding to the second predefined voltage. In some embodiments, in response to receiving a command from a host system, the DIMM device replaces (314) the first set of configuration parameters. In some embodiments the second set of configuration parameters are replaced as well.

In some embodiments, performing (316) the one or more power-up operations includes de-asserting a reset applied to one or more non-volatile memory controllers in the DIMM. In some embodiments, this includes de-asserting a reset applied to a memory module controller in the DIMM. In some embodiments, a separate reset signal is asserted and de-asserted for each of the other controllers in the DIMM.

In some embodiments, a value of the usage counter (318) is a current sum of time accumulated since power-up. For example, this usage counter can be based on a real-time clock in the microcontroller. Furthermore, in some embodiments, the method further comprises the DIMM device determining (320) an accelerated time measurement based at least in part on the value of the usage counter and the monitored temperature of the DIMM. In some embodiments, the accelerated time measurement is determined in response to a host request or is constantly calculated and stored in non-volatile memory of the controller (e.g., SPD/supervisory controller 124, FIG. 1).

The method further includes, at a controller of the DIMM device, monitoring (322) a temperature of the DIMM. In some embodiments, this temperature is measured for monitoring, by a thermocouple in the controller (e.g., thermocouple or temp sensor 240 in SPD/supervisory controller 124, FIG. 2). In some embodiments, this temperature is measure for monitoring by thermal sensors in each flash controller (e.g., temperature sensors 160 in flash controllers 130, FIG. 1) of the DIMM device.

The method further includes, at a controller of the DIMM device, monitoring (324) the DIMM for occurrence of one or more of a set of predetermined trigger events. In some embodiments, the set of predetermined events includes (326) two or more of: a temperature measurement of the DIMM in excess of a predefined temperature, a power failure condition, a predefined condition corresponding to a predefined command received from a host, a current number of program-erase cycles performed on respective flash memory portions of the DIMM matches predefined criteria. In response to detecting one of the set of predetermined trigger events, the DIMM device logs (328) information corresponding to the detected predetermined event. In some embodiments, this information corresponding to the detected predetermined event is stored in non-volatile memory in a controller (e.g., SPD/supervisory controller 124, FIG. 1) or in some other non-volatile memory in the DIMM device.

In some embodiments, the power supply criteria further include (330) a requirement that a SPD supply voltage provided to the DIMM is a predefined SPD supply voltage (e.g., an industry standard for SPD voltage such as 3.3V).

In some embodiments, the method further includes in accordance with a determination that power supply criteria are not satisfied, the device performs (332) one or more lock-out functions. For example, the SPD/supervisory controller may initiate a lock-out protocol preventing the host from reading or writing data to the flash devices on the DIMM device. In this example, the plurality of memory controllers (e.g., memory controller 128, FIG. 1) and flash memories in the DIMM (e.g., flash memories 140, 142, FIG. 1), would effectively be isolated from the host.

In some embodiments, the method further includes the device monitoring (334) a charge of an energy storage device in a data hardening module (e.g., energy storage device 150 in data hardening module 126, FIG. 1, or more specifically one or more capacitors in energy storage device 150). In some embodiments, the power supply criteria further include (336) a requirement that a charge of an energy storage device in a data hardening module meets a predefined minimum charge level (e.g., the SPD/supervisory controller 124 in FIG. 1 checks the charge value of one or more capacitors in energy storage device 150).

In some embodiments, the method further includes in response to detecting one of the set of events, the DIMM device sends (338) a notification to a host system. For example, if the temperature of the DIMM exceeds a predefined threshold, in some embodiments, the DIMM device sends a notification of the temperature event to the host system via host interface (e.g., host interface 122, FIG. 1). This may trigger the host to perform some other action in response, such as increasing the speed of the fan. In some embodiments, the DIMM device sends a bare notification to the host, and then the host determines the type of event by reading logged information from the SPD.

In some embodiments, the method further includes the DIMM device receiving (340) a request for information from a host system. For example, the host system requests to know the current number of program-erase cycles performed on one or more flash memory portions. In response to the request, the DIMM device sends (342) the host system the requested information.

In some implementations, with respect to any of the methods described above, the non-volatile memory is a single flash memory device, while in other implementations the non-volatile memory includes a plurality of flash memory devices.

In some implementations, with respect to any of the methods described above, a storage device includes (1) an interface for coupling the storage device to a host system, (2) a plurality of controllers, each of the plurality of controllers configured to transfer data held in volatile memory to non-volatile memory, and (3) a data hardening module including one or more processors and an energy storage device, the storage device configured to perform or control performance of any of the methods described above.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method of performing supervisory functions for a dual in-line memory module (DIMM), at a controller in the DIMM, comprising:
   upon power-up, determining a power supply voltage provided to the DIMM;
   in accordance with a determination that power supply criteria are satisfied, the power supply criteria including a requirement that a power supply voltage provided to the DIMM falls within one of N predefined voltage ranges, wherein N is an integer greater than one:
      performing one or more power-up operations, including initiating a usage counter;
      monitoring a temperature of the DIMM;
      monitoring the DIMM for occurrence of one or more of a set of predetermined trigger events,
         wherein the set of predetermined trigger events is selected from the group consisting of a temperature measurement of the DIMM in excess of a predefined temperature and a current number of program-erase cycles performed on respective flash memory that meets predefined criteria; and
      in response to detecting one of the set of predetermined trigger events, logging information corresponding to the detected trigger event, wherein the logging includes storing the logged information in non-volatile memory in the DIMM.

2. The method of claim 1, wherein the power supply criteria further include a requirement that a SPD supply voltage provided to the DIMM is a predefined SPD supply voltage.

3. The method of claim 1, further comprising:
   in accordance with a determination that power supply criteria are not satisfied, performing one or more lock-out functions.

4. The method of claim 1, wherein performing the one or more power-up operations includes:
   in accordance with a determination that the power supply voltage provided to the DIMM is a first predefined voltage, executing a memory module function using first set of configuration parameters corresponding to the first predefined voltage; and
   in accordance with a determination that the power supply voltage provided to the DIMM is a second predefined voltage, executing the memory module function using a second set of configuration parameters corresponding to the second predefined voltage.

5. The method of claim 4, further comprising:
   in response to receiving a command from a host system, replacing the first set of configuration parameters.

6. The method of claim 1, wherein performing the one or more power-up operations includes de-asserting a reset applied to one or more non-volatile memory controllers in the DIMM.

7. The method of claim 1, further comprising:
   monitoring a charge of an energy storage device in a data hardening module.

8. The method of claim 7, wherein the power supply criteria further include a requirement that a charge of an energy storage device in the data hardening module meets a predefined minimum charge level.

9. The method of claim 1, wherein a value of the usage counter is a current sum of time accumulated since power-up.

10. The method of claim 9, further comprising:
    determining an accelerated time measurement based on the value of the usage counter and the monitored temperature of the DIMM.

11. The method of claim 1, further comprising:
    in response to detecting one of the set of events, sending a notification to a host system.

12. The method of claim 1, further comprising:
    receiving a request for information from a host system; and
    in response to the request, sending the host system the requested information.

13. The method of claim 1, wherein the controller in the DIMM is coupled using serial presence detect (SPD) pins, with an interface for the DIMM, wherein the interface for the DIMM is configured to be coupled with a memory bus.

14. A dual in-line memory module (DIMM) device, comprising:
    an interface for coupling the DIMM device to a host system; and
    a controller in the DIMM, the controller configured to:
       upon power-up, determine a power supply voltage provided to the DIMM;
       in accordance with a determination that power supply criteria are satisfied, the power supply criteria including a requirement that a power supply voltage provided to the DIMM falls within one of N predefined voltage ranges, wherein N is an integer greater than one:
          perform one or more power-up operations, including initiating a usage counter;
          monitor a temperature of the DIMM;
          monitor the DIMM for occurrence of one or more of a set of predetermined trigger events,
       wherein the set of predetermined trigger events is selected from the group consisting of a temperature measurement of the DIMM in excess of a predefined temperature and a current number of program-erase cycles performed on respective flash memory that meets predefined criteria; and
          in response to detecting one of the set of predetermined trigger events, log information corresponding to the detected trigger event, wherein the logged information is stored in non-volatile memory in the DIMM.

15. The dual in-line memory module (DIMM) device of claim 14, wherein the power supply criteria further include a requirement that a SPD supply voltage provided to the DIMM is a predefined SPD supply voltage.

16. The dual in-line memory module (DIMM) device of claim 14, wherein the controller is further configured to:
    performing one or more lock-out functions in accordance with a determination that power supply criteria are not satisfied.

17. The dual in-line memory module (DIMM) device of claim 14, wherein performing the one or more power-up operations includes:
  in accordance with a determination that the power supply voltage provided to the DIMM is a first predefined voltage, executing a memory module function using first set of configuration parameters corresponding to the first predefined voltage; and
  in accordance with a determination that the power supply voltage provided to the DIMM is a second predefined voltage, executing the memory module function using a second set of configuration parameters corresponding to the second predefined voltage.

18. A non-transitory computer readable storage medium, storing one or more programs for execution by one or more processors of a dual in-line memory module (DIMM) device having one or more controllers, the one or more programs including instructions for:
  upon power-up, determining a power supply voltage provided to the DIMM;
  in accordance with a determination that power supply criteria are satisfied, the power supply criteria including a requirement that a power supply voltage provided to the DIMM falls within one of N predefined voltage ranges, wherein N is an integer greater than one:
    performing one or more power-up operations, including initiating a usage counter;
    monitoring a temperature of the DIMM;
    monitoring the DIMM for occurrence of one or more of a set of predetermined trigger events,
  wherein the set of predetermined trigger events is selected from the group consisting of a temperature measurement of the DIMM in excess of a predefined temperature and a current number of program-erase cycles performed on respective flash memory that meets predefined criteria; and
    in response to detecting one of the set of predetermined trigger events, logging information corresponding to the detected trigger event, wherein the logging includes storing the logged information in non-volatile memory in the DIMM.

* * * * *